United States Patent
Gilbert

(10) Patent No.: US 8,319,552 B1
(45) Date of Patent: Nov. 27, 2012

(54) RAIL-TO-RAIL OUTPUT STAGE WITH BALANCED DRIVE

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/772,077

(22) Filed: Apr. 30, 2010

Related U.S. Application Data

(60) Provisional application No. 61/291,822, filed on Dec. 31, 2009.

(51) Int. Cl.
*H03F 3/45* (2006.01)
(52) U.S. Cl. .......................... 330/255; 330/257; 330/252
(58) Field of Classification Search .................. 330/255, 330/257, 252
See application file for complete search history.

(56) References Cited

U.S. PATENT DOCUMENTS

| | | | |
|---|---|---|---|
| 5,285,168 A * | 2/1994 | Tomatsu et al. ............... | 330/253 |
| 5,475,339 A | 12/1995 | Maida | |
| 5,966,050 A * | 10/1999 | Yoshino et al. ............... | 330/255 |
| 6,104,244 A | 8/2000 | Gilbert | |
| 6,208,208 B1 * | 3/2001 | Komatsu et al. .............. | 330/255 |
| 6,265,929 B1 | 7/2001 | Hauser | |
| 7,495,511 B2 | 2/2009 | Gilbert et al. | |
| 7,545,214 B2 * | 6/2009 | Rallabandi et al. ........... | 330/255 |
| 7,605,656 B2 * | 10/2009 | Sung ............................ | 330/258 |
| 7,825,727 B2 * | 11/2010 | Shimatani ..................... | 330/253 |

OTHER PUBLICATIONS

Gilbert, B., "Translinear Circuits: An Historical Overview," Kluwer Academic Publishers, 1996, 24 pages.
Gregorian, Roubik, "Introduction to CMOS OP-Ams and Comparators," John Wiley & Sons, Inc., 1999, 18 pages.
Gray, Paul et al., "Analysis and Design of Analog Integrated Circuits," Third Edition, John Wiley & Sons, Inc., 1993, 28 pages.

* cited by examiner

*Primary Examiner* — Patricia Nguyen
(74) *Attorney, Agent, or Firm* — Marger Johnson & McCollom PC

(57) ABSTRACT

An amplifier having an imbalance between pull-up and pull-down sections may include a counterpart section to balance the output sections and/or enable them to be driven by balanced drive signals. In one embodiment, a rail-to-rail output stage may include a current minor to drive one side of the circuit. The other side may be driven by a transistor having a counterpart transistor to balance the circuit. A drive section may include a balance point to facilitate balancing the drive signals.

15 Claims, 6 Drawing Sheets

RAIL-TO-RAIL OUTPUT STAGE WITH BALANCED DRIVE

RELATED APPLICATION

This application claims priority from U.S. Provisional Patent Application Ser. No. 61/291,822 entitled "Rail-to-Rail Output Stage with Pivot Point for Inherent Balanced Drive," filed Dec. 31, 2009, which is incorporated by reference.

BACKGROUND

FIG. 1 illustrates a classic push-pull output stage for an operational amplifier. Pull-up transistor $Q_P$ provides output current $I_L$ in the positive direction by pulling the potential of the output node $V_{OUT}$ toward the positive power supply rail $V_P$, while pull-down transistor $Q_N$ provides output current in the negative direction by pulling $V_{OUT}$ toward the negative supply rail $V_N$. Diodes D1 and D2, which are typically realized as diode-connected transistors, reduce crossover distortion by causing the circuit to behave as a class AB amplifier with $Q_P$ and $Q_N$ each conducting a small bias current when the input signal $V_{IN}$ is zero. Diodes D1 and D2 also form a translinear loop with the base-emitter junctions of $Q_P$ and $Q_N$ to provide a well-defined, constant product characteristic where the product of $I_P$ and $I_N$ is proportional to the bias current $I_B$.

Because the output transistors $Q_P$ and $Q_N$ are arranged in a common-collector (emitter follower) configuration, the potential of the output terminal $V_{OUT}$ must always be at least one base-emitter voltage ($V_{BE}$) below the positive rail $V_P$ and one $V_{BE}$ above the negative rail $V_N$. This may reduce the available output voltage swing to an unacceptable range, especially in systems with low power supply voltages.

To provide rail-to-rail operation, the output transistors may be arranged in a common-emitter configuration as shown in FIG. 2. Although this increases the output swing, it generally prevents the output transistors from forming part of a translinear loop. Therefore, replication transistors $Q_{RP}$ and $Q_{RN}$ may be used to generate currents $I_{RP}$ and $I_{RN}$ that replicate the currents through the output transistors. The replica currents may then be applied to a translinear loop in a drive circuit 6 which is used to drive the output transistors $Q_P$ and $Q_N$.

U.S. Pat. No. 6,104,244, which is by the same inventor as the present disclosure, describes some improved rail-to-rail amplifier techniques in which one of the output transistors is arranged in a translinear loop, while a replica of the current from the other output transistor is applied to the loop in a manner that may maintain constant product operation.

FIG. 3 illustrates another approach to providing a rail-to-rail output in which one of the output transistors $Q_N$ is arranged in a current minor configuration with another transistor $Q_A$. A drive circuit 8 provides separate drive signals to the output transistors $Q_P$ and $Q_N$ in response to the input signal $V_{IN}$. A disadvantage of this configuration, as well as some of the other configurations above, is that the pull-up and pull-down portions of the circuits are driven asymmetrically. This lack of symmetry in sourcing and sinking current to a load, as well as other nonlinearities, may cause distortion in the output signal.

DETAILED DESCRIPTION

Figure 1:
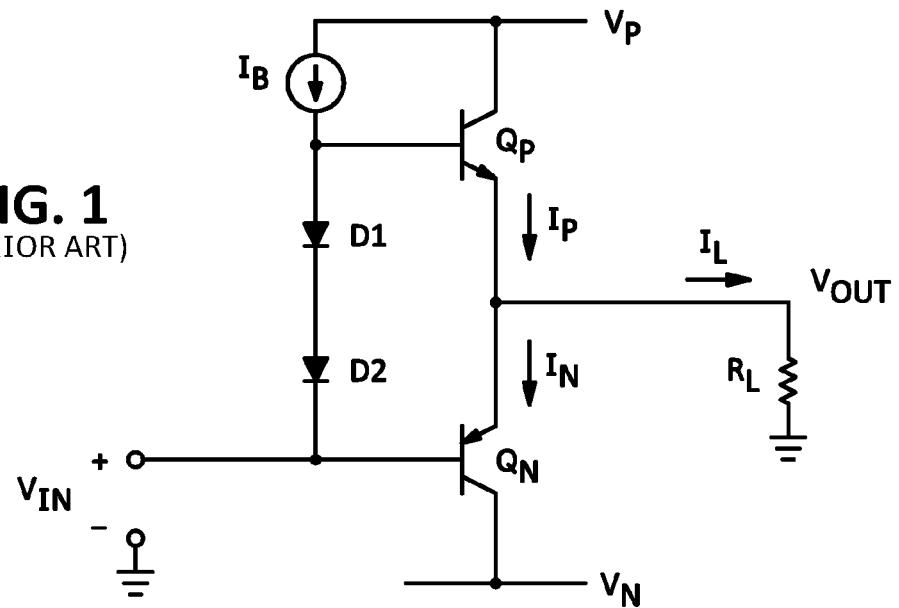
FIG. 1 illustrates a prior art output stage for an operational amplifier.
Figure 2:
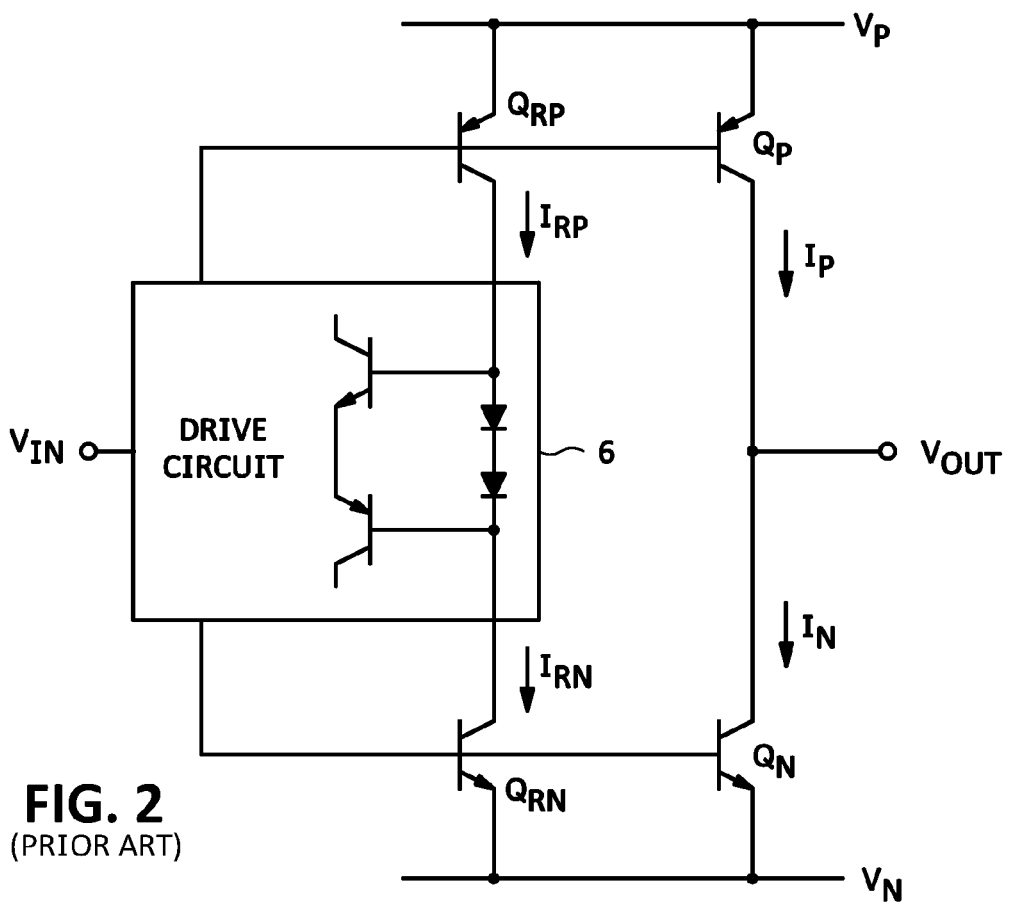
FIG. 2 illustrates a prior art rail-to-rail output stage.
Figure 3:
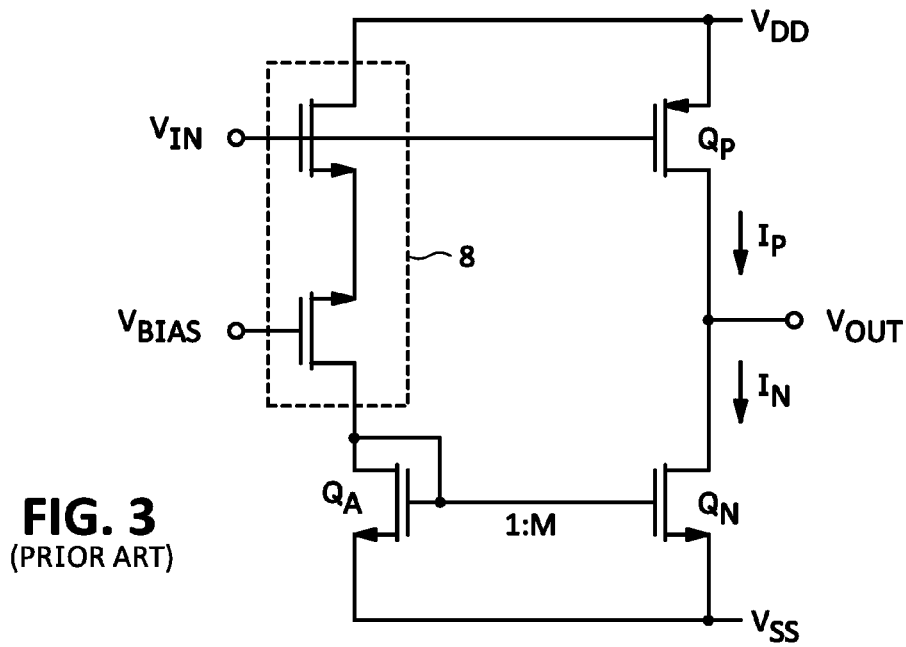
FIG. 3 illustrates another prior art rail-to-rail output stage.
Figure 4:
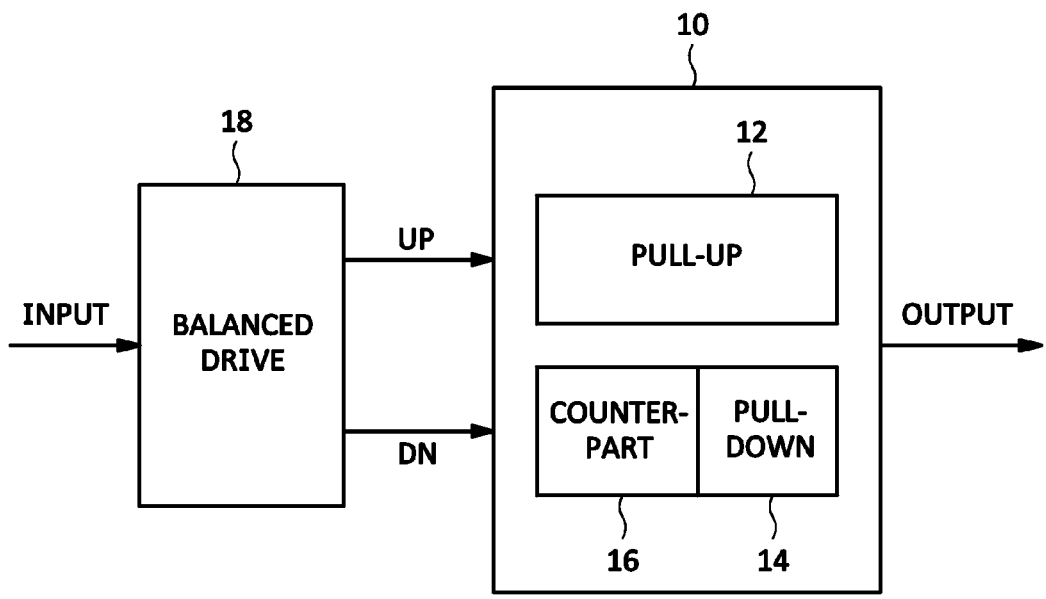
FIG. 4 illustrates an embodiment of an amplifier according to some inventive principles of this patent disclosure.

FIG. 4 illustrates an embodiment of an amplifier according to some inventive principles of this patent disclosure. A combined output section 10 includes a pull-up output section 12 and a pull-down output section 14 that drive the output in response to complementary drive signals UP and DN. A drive section 18 generates the drive signals UP and DN in a balanced manner in response to the input. The pull-up and pull-down sections may be unbalanced because of, for example, different circuit configurations, drive requirements, loading factors, etc. A counterpart section 16 is included to balance the pull-up and pull-down sections to enable them to be driven effectively by the balanced drive signals. In FIG. 4, the counterpart section is shown conceptually as being associated with the pull-down section, but in other embodiments, it may be associated with the pull-up section, associated with both sections, or otherwise arranged to provide balance to the unbalanced output sections.

The output sections may be implemented with any suitable arrangement of transistors of any type, polarity, configuration, etc. This includes BJTs (NPN or PNP), COMS (N-channel or P-channel), etc., configured as single transistors, Darlingtons, current mirrors, emitter (source) followers, common emitter (source) stages, multi-stage configurations, etc. The balanced drive circuit may be realized in any suitable configuration to provide balanced drive signals, again, with any suitable arrangement of transistors of any type, polarity, configuration, etc. This includes differential pairs, cascodes, LNAs, etc.

Figure 5:
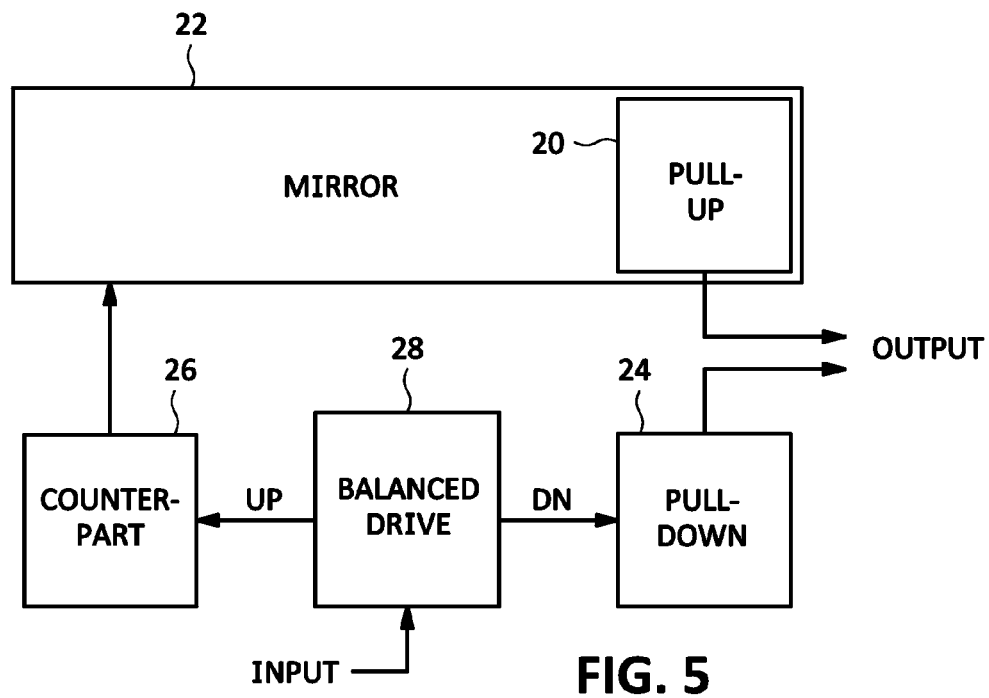
FIG. 5 illustrates another embodiment of an amplifier according to some inventive principles of this patent disclosure.

FIG. 5 illustrates another embodiment of an amplifier according to some inventive principles of this patent disclosure. A pull-up circuit 20 is included as part of a minor circuit 22. Outputs from the pull-up circuit 20 and a pull-down circuit 24 are combined to provide the output drive. A circuit 26 provides a counterpart to the pull-down circuit 24 to enable the output stage to be driven in a balanced manner by pull-up and pull-down drive signals UP and DN in response to the input. Counterpart circuit 26 may include one or more components that are identical to one or more components in the pull-down circuit, matched to one or more components in the pull-down circuit, scaled with one or more components in the pull-down circuit, complementary to one or more components in the pull-down circuit, or otherwise arranged to impart balance to the system. The mirror circuit may be implemented with any suitable current-minor configuration including a basic two-transistor current minor, with or without current gain, a Widlar current minor, a Wilson current minor, a low drop-out current minor such as the type disclosed in U.S. Pat.

No. 6,437,630 by the same inventor as the present disclosure, compound minors, multi-stage mirrors, cascoded minors, etc.

Figure 6:
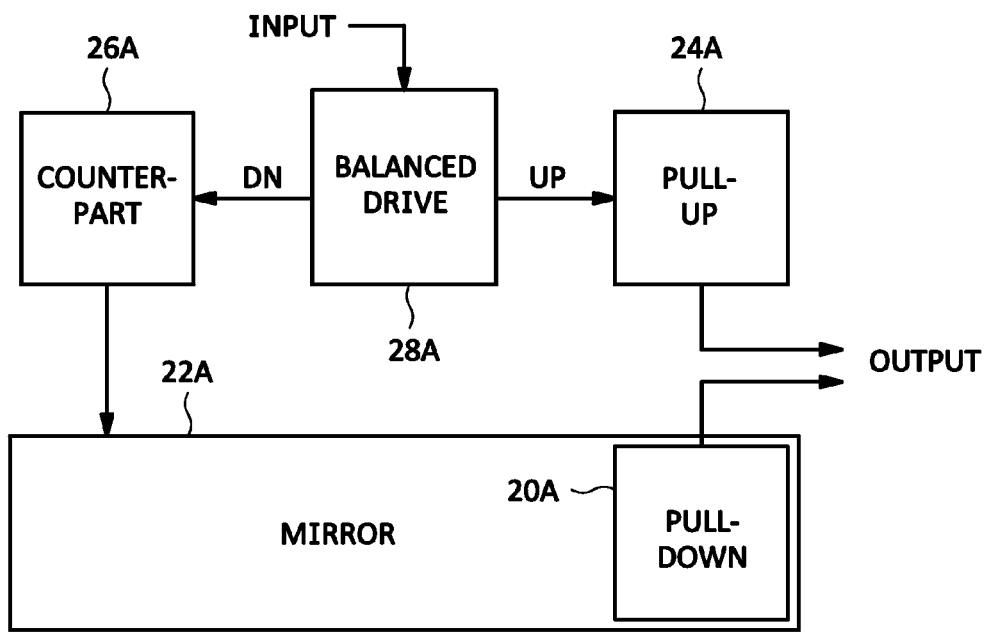
FIG. 6 illustrates another embodiment of an amplifier according to some inventive principles of this patent disclosure.

In the embodiment of FIG. 5, the pull-up circuit is included as part of a minor circuit, but in other embodiments, the pull-down circuit may be included in the mirror circuit as shown in FIG. 6.

Figure 7:
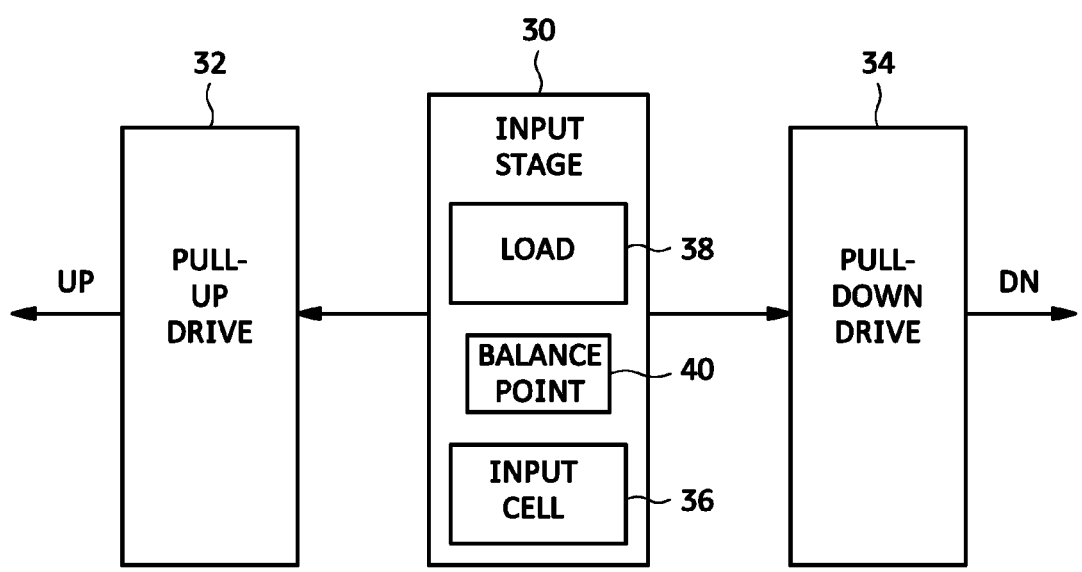
FIG. 7 illustrates an embodiment of a balanced drive circuit according to some inventive principles of this patent disclosure.

FIG. 7 illustrates an embodiment of a balanced drive circuit according to some inventive principles of this patent disclosure. The embodiment of FIG. 7 includes an input stage 30, a pull-up driver 32, and a pull-down driver 34. In this embodiment, the input stage includes an input cell 36 and a load 38. In some embodiments, the load may be omitted, while in other embodiments, the load or loads may be integrated in the drivers or arranged in any other suitable configuration. The input stage includes balance point 40 through or about which balance is imparted to the drive signals UP and DN. In this embodiment, the balance point is shown symbolically between the input cell and load, but in other embodiments, it may be located in the input cell, the load, elsewhere in the input stage, distributed throughout the circuit, etc.

The balance point may include one or more physical nodes or components; it may include a conceptual point, i.e., a centroid or other place through or about which balance is maintained; it may be centralized or distributed, etc.

The pull-up and pull-down drivers may include voltage and/or current gain, level shifting, buffering, etc. The input stage may be implemented with any suitable arrangement of transistors of any type, polarity, configuration, etc. This includes BJTs, CMOS, J-FETs, etc., arranged as differential pairs, e.g., transconductance (gm) cells, cascodes, emitter followers, LNAs etc.

Although the drive circuit of FIG. 7 may be suitable for use for the drive circuits in any of the embodiments of FIGS. 4-6, it may be used in conjunction with any arrangement of output stage that may benefit from a balanced drive.

Figure 8:
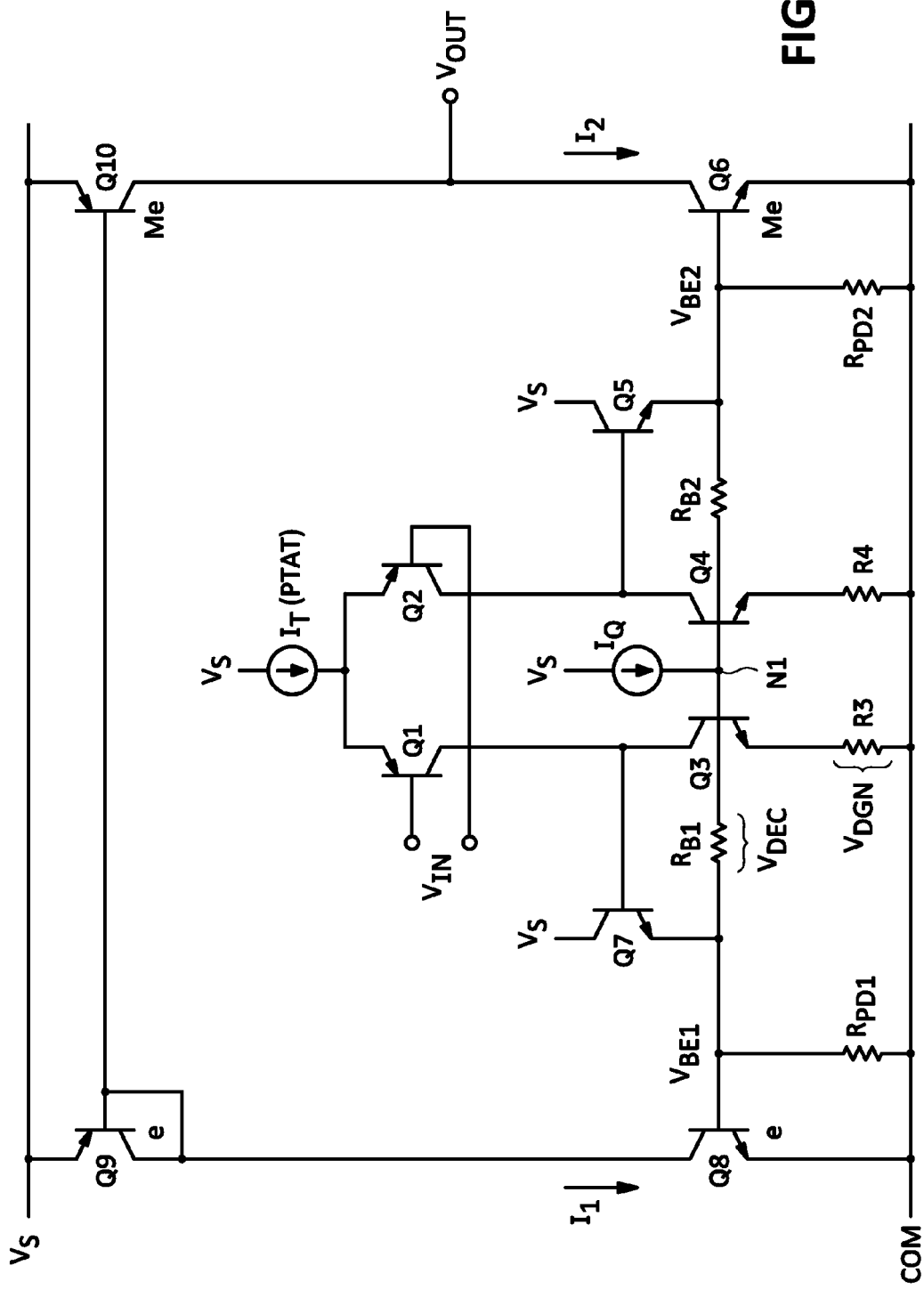
FIG. 8 illustrates another embodiment of an amplifier according to some inventive principles of this patent disclosure.

FIG. 8 illustrates an embodiment of a rail-to-rail amplifier according to some inventive principles of this patent disclosure. A pull-down output is provided by NPN transistor Q6. A pull-up output is provided by PNP transistor Q10 which forms a current minor with Q9. Transistor Q9, in turn, is driven by NPN transistor Q8 which can be viewed as a counterpart to Q6 to enable the system to achieve balanced drive signals at Q6 and Q8. The current minor Q9-Q10 and the emitter areas of Q8 and Q6 are ratioed by the same factor 1:M so that Q8 can drive the pull-up side of the output without having to carry the full output current. Thus, the $V_{BE}$ of Q8 ($V_{BE1}$) is equal to the $V_{BE}$ of Q6 ($V_{BE2}$) for equal values of "push" or "pull" output current, even though Q8 only operates at a fraction of the current of Q6.

The input signal $V_{IN}$ is applied to the bases of a differential pair of common-emitter PNP transistors Q1 and Q2 which are biased by a proportional to absolute temperature (PTAT) tail current $I_T$. In this embodiment, the circuit is capable of single-supply operation, so the negative power supply rail is designated as a common terminal COM or ground, and the positive power supply rail is designated as the supply $V_S$, however, the circuit may also be operated from dual power supplies. Using a PNP input stage enables the input to swing almost to ground when configured for single supply operation.

The input pair Q1 and Q2 are loaded by a pair of NPN current source transistors Q3 and Q4 which, in this example, are emitter degenerated by resistors R3 and R4 to reduce the effects of noise. Depending on the implementation details, a few hundred mV of degeneration may typically be adequate. In this embodiment, an example value of 200 mV is assumed.

Rather than connecting Q3 and Q4 as a current mirror, however, their bases are anchored to node N1 which serves as a pivot point as described below.

To enhance balance in the system, the $V_{BE}$ of Q6 and the $V_{BE}$ of Q8 are preferably close to the same value under zero input signal conditions. Thus, Q1-Q4 are arranged as an automatic loop to drive Q6 and Q8 through emitter followers Q5 and Q7. Initially, the tail current $I_T$ flows into the bases of Q5 and Q7 and then into the bases of Q6 and Q8. Once current is established in Q6 and Q8, $V_{BE1}$ and $V_{BE2}$ are asserted at the bases of Q6 and Q8.

In the absence of $R_{B1}$ and $R_{B2}$, Q6 and Q8 may be driven with too much voltage because the degeneration voltage $V_{DGN}$ across R3 and R4 is added to the $V_{BE}$ of Q3 and Q4. Therefore, a current source k is included to create a decrementing voltage $V_{DEC}$ across $R_{B1}$ and $R_{B2}$. The decrementing voltage $V_{DEC}$ may be a multiple or fraction of kT/q and is preferably made to equal the degeneration voltage $V_{DGN}$. Thus, the quiescent current in Q6 and Q8 may be governed only by emitter relationships between the transistors. Resistors $R_{PD1}$ and $R_{PD2}$ absorb the current through $R_{B1}$ and $R_{B2}$, and the excess current through $R_{PD1}$ and $R_{PD2}$ becomes the emitter currents in Q5 and Q7. Resistors $R_{PD1}$ and $R_{PD2}$ could alternatively be implemented with current sources.

The bases of Q3 and Q4 are held at a constant common mode voltage because the voltage at the pivot point (node N1) is defined by how much tail current is provided by $I_T$, the size of the degeneration resistors R3 and R4, and the $V_{BE}$ of Q3 and Q4. Thus, the pivot point is maintained at a defined voltage, and the loop may be conceptualized as causing the entire circuit to swivel around the pivot point. Continuing with the pivot analogy, just as a heavier weight placed close to a fulcrum can balance a lighter weight further from the fulcrum, so can the ratio M be made larger to allow a smaller current I1 in Q8 to balance a larger current I2 in Q6.

The inventive principles of this patent disclosure may enable the realization of a low quiescent current push-pull output stage that eliminates some problems associated with driving the complementary output transistors. For example, in the embodiment of FIG. 8, if Q3 and Q4 where configured as a current mirror, additional resistors would be needed to attempt to provide a balanced drive to the two sides of the output. But such a configuration is inherently imbalanced and awkward. The pivot point used here, however is inherently balanced. That is, in the embodiment of FIG. 8, balance is achieved through symmetry of the circuit, which is centered on the pivot point N1.

The inventive principles of this patent disclosure may also enable the realization of robust, "designable" solutions. For example, the design and operation of the embodiment of FIG. 8 does not depend on the absolute beta of transistors, resistor values, etc., but rather ratios of circuit parameters.

The inventive principles of this patent disclosure may also enable the realization of adaptive circuit operation with respect to a balance point. For example, in the embodiment of FIG. 8, the current source k and node N1 may be used to implement an adaptive common mode scheme where node N1 is driven in response to, or used as a reference for, a common mode circuit.

Figure 9:
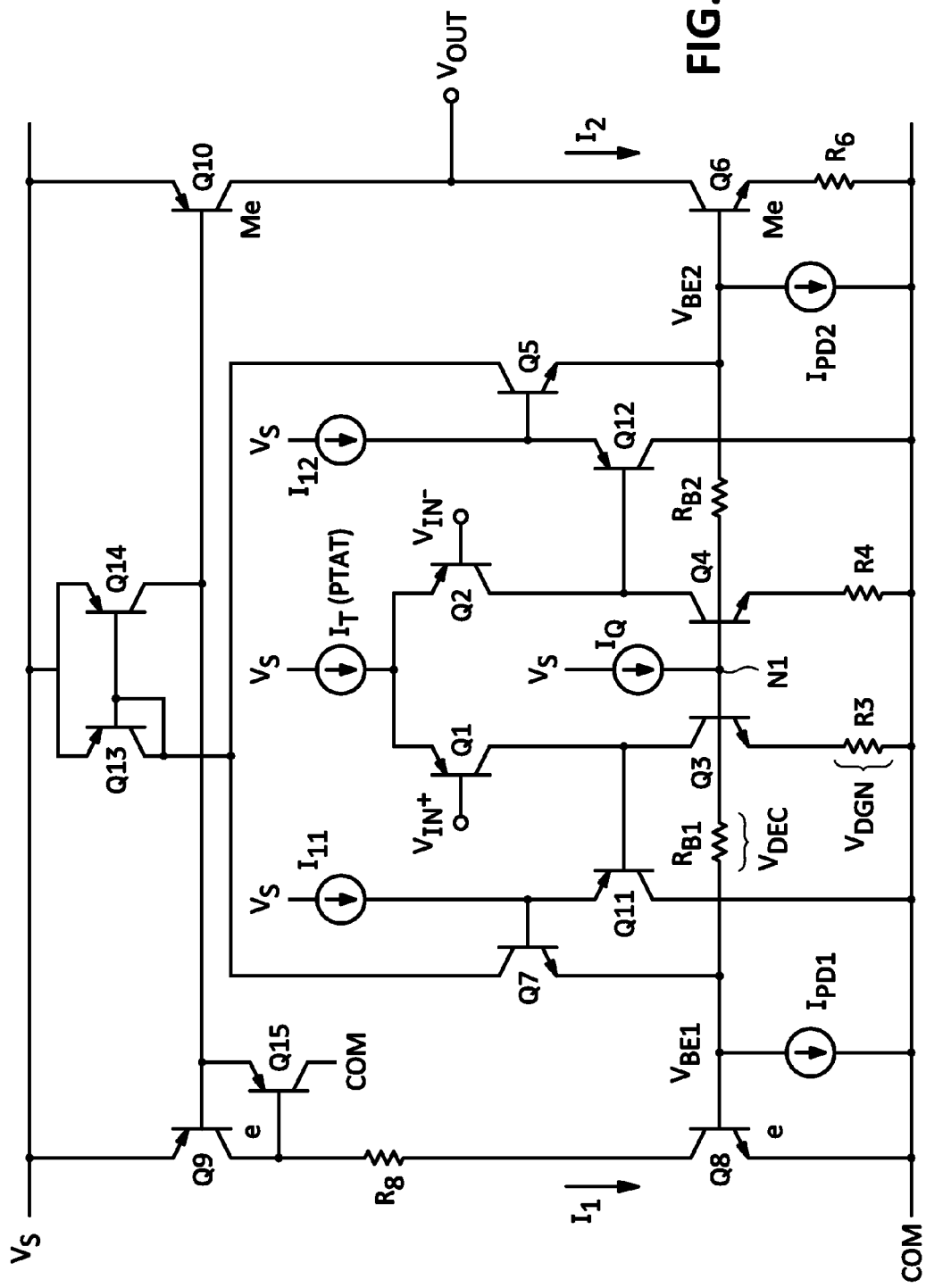
FIG. 9 illustrates another embodiment of an amplifier according to some inventive principles of this patent disclosure.

FIG. 9 illustrates another embodiment of a rail-to-rail amplifier according to some inventive principles of this patent disclosure. The embodiment of FIG. 9 is similar to that of FIG. 8 but includes some additional refinements as follows. Emitter followers Q5 and Q7 are now driven through common-collector transistors Q12 and Q11 which may provide additional current gain and improve the input voltage headroom. Also, the collectors of Q5 and Q7 are now supplied by one side of current minor Q13-Q14 which has its other side connected to the base of Q10. Resistors $R_{PD1}$ and $R_{PD2}$ are replaced by current sources $I_{PD1}$ and $I_{PD2}$. Transistor Q15 is added to the current mirror Q9-Q10 to provide current gain. Resistors R6 and R8 provide output current limiting. As with the other embodiments, for purposes of describing emitter area ratios, "e" indicates a unit of emitter area, while "Me" indicates M units of area.

The embodiments described herein can be modified in arrangement and detail without departing from the inventive concepts. For example, some embodiments have been described and illustrated in the context of BJT transistors of specific polarities, but the same inventive principles may be realized in other embodiments with CMOS or J-FET transistors, with different polarities, etc. Thus, references to various elements and configurations of one type of transistor also encompasses the corresponding elements and configurations of other types of transistors, e.g., emitter-follower is understood to also refer to source-follower, emitter degeneration also refers to source degeneration, base is understood to also refer to gate, etc. As a further example, some embodiments have been described and illustrated with functional blocks in specific orders and configurations, but the same inventive principles may be realized in other embodiments in which the order and configuration of the functional blocks is changed. As another example, some embodiments are described in the context of unbalanced pull-up and pull-down sections that are due to different circuit configurations; however, some of the inventive principles may also be applicable to systems in which the imbalance may be caused by asymmetric loads on the pull-up and pull-down sections, or other reasons. Accordingly, such changes and modifications are considered to fall within the scope of the following claims.

The invention claimed is:

1. An amplifier comprising:
   a first output section to drive an output in response to a first drive signal;
   a second output section to drive the output in response to a second drive signal;
   a counterpart section to balance the first output section with the second output section; and
   a balanced drive section to generate the first and second drive signals in response to an input signal;
   where the balanced drive section comprises a balance point.

2. An amplifier comprising:
   a first output section to drive an output in response to a first drive signal;
   a second output section to drive the output in response to a second drive signal;
   a counterpart section to balance the first output section with the second output section; and
   a balanced drive section to generate the first and second drive signals in response to an input signal;
   where the counterpart section is coupled between the balanced drive section and the second output section;
   where the balanced drive section comprises:
      an input stage;
      a first drive circuit coupled between the input stage and the first output section; and
      a second drive circuit coupled between the input stage and the counterpart section;
   where the input stage comprises:
      an input cell; and
      a load coupled to the input cell; and
   where the input stage comprises a balance point.

3. The amplifier of claim 2 where the balance point is located in the load.

4. An amplifier comprising:
   a first output section to drive an output in response to a first drive signal;
   a second output section to drive the output in response to a second drive signal;
   a counterpart section to balance the first output section with the second output section; and
   a balanced drive section to generate the first and second drive signals in response to an input signal;
   where the second output section comprises a mirror circuit;
   where the first output section and the counterpart section comprise transistors of the same type and configuration; and
   where the balanced drive section comprises a balance point.

5. A rail-to-rail output circuit comprising:
   a first transistor coupled to a first power supply to provide a first output current;
   a second transistor coupled to a second power supply to provide a second output current;
   a third transistor arranged to form a current minor with the first transistor;
   a fourth transistor coupled between the current mirror and the second power supply; and
   a drive circuit arranged to drive the second and fourth transistors with balanced drive signals;
   where:
      the drive circuit comprises an input cell and a load coupled to the input cell;
      the second transistor is coupled to a first output of the input cell; and
      the fourth transistor is coupled to a second output of the input cell; and
   where:
      the input cell comprises a transconductance cell; and
      the load comprises fifth and sixth transistors arranged symmetrically about a pivot point.

6. The circuit of claim 5 where the input cell and load are arranged as an automatic loop to drive the second and fourth transistors.

7. The circuit of claim 5 where the fifth and sixth transistors are degenerated.

8. The circuit of claim 7 where the drive circuit further comprises first and second resistors arranged to compensate for the degeneration of the fifth and sixth transistors.

9. The circuit of claim 8 where the drive circuit further comprises a current source coupled to the pivot point to establish a compensation voltage across the first and second resistors.

10. The circuit of claim 9 where the second and fourth transistors are coupled to the input cell through follower transistors.

11. A rail-to-rail output circuit comprising:
    a first transistor coupled to a first power supply to provide a first output current;
    a second transistor coupled to a second power supply to provide a second output current;
    a third transistor arranged to form a current minor with the first transistor;
    a fourth transistor coupled between the current mirror and the second power supply; and
    a drive circuit arranged to drive the second and fourth transistors with balanced drive signals;
    where:
       the current mirror has a ratio; and the second and fourth transistors have the same ratio as the current mirror.

12. A method comprising driving an output node with a first current from a first power supply;

driving the output node with a second current from a second power;

generating the second current in response to a third current;

generating the first current in response to a first drive signal and the third current in response to a second drive signal;

balancing the first current and the third current; and generating the first drive signal and the second drive signal in response to an input signal using a balanced drive section;

where the balanced drive section comprises a balance point.

13. The method of claim 12 where:

the first current is provided by a first output drive section;

the second current is provided by a second output drive section in response to the third current; and the first current and the third current are balanced with a counterpart to the first output drive section.

14. The method of claim 13 where the second output drive section comprises a current mirror.

15. The method of claim 12 where the first current and the third current are generated symmetrically.

\* \* \* \* \*

UNITED STATES PATENT AND TRADEMARK OFFICE
CERTIFICATE OF CORRECTION

PATENT NO. : 8,319,552 B1
APPLICATION NO. : 12/772077
DATED : November 27, 2012
INVENTOR(S) : Barrie Gilbert Page 1 of 1

It is certified that error appears in the above-identified patent and that said Letters Patent is hereby corrected as shown below:

IN THE CLAIMS

Column 6, line 60: the word: "minor" should read: "mirror"

Signed and Sealed this
Sixteenth Day of April, 2013

Teresa Stanek Rea
*Acting Director of the United States Patent and Trademark Office*

UNITED STATES PATENT AND TRADEMARK OFFICE
CERTIFICATE OF CORRECTION

Page 1 of 1

PATENT NO.         : 8,319,552 B1
APPLICATION NO.    : 12/772077
DATED              : November 27, 2012
INVENTOR(S)        : Gilbert It is certified that error appears in the above-identified patent and that said Letters Patent is hereby corrected as shown below:

On the title page item (57), in the Abstract, line 4, the word "minor" should be replaced with --mirror--.

In the Specification
Column 2, line 51, the word "minor" should be replaced with --mirror--.
Column 2, line 64, the word "minor" should be replaced with --mirror--.
Column 2, line 65, the word "minor" should be replaced with --mirror--.
Column 2, line 66, the word "minor" should be replaced with --mirror--.
Column 2, line 66, the word "minor" should be replaced with --mirror--.
Column 2, line 67, the word "minor" should be replaced with --mirror--.
Column 3, line 2, the word "minors" should be replaced with --mirrors--.
Column 3, line 2, the word "minors" should be replaced with --mirrors--.
Column 3, line 4, the word "minor" should be replaced with --mirror--.
Column 6, line 23, the word "minor" should be replaced with --mirror--.

Signed and Sealed this
Seventeenth Day of September, 2013

Teresa Stanek Rea
*Deputy Director of the United States Patent and Trademark Office*